United States Patent
Riegler et al.

(10) Patent No.: US 10,811,529 B2
(45) Date of Patent: Oct. 20, 2020

(54) TRANSISTOR DEVICE WITH GATE RESISTOR

(71) Applicant: Infineon Technologies Austria AG, Villach (AT)

(72) Inventors: Andreas Riegler, Lichtpold (AT); Christian Fachmann, Fuernitz (AT); Bjoern Fischer, Munich (DE); Franz Hirler, Isen (DE); Gabor Mezoesi, Villach (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 5 days.

(21) Appl. No.: 16/380,762

(22) Filed: Apr. 10, 2019

(65) Prior Publication Data

US 2019/0319124 A1  Oct. 17, 2019

(30) Foreign Application Priority Data

Apr. 11, 2018  (DE) .......... 10 2018 108 561

(51) Int. Cl.
| | |
|---|---|
| *H01L 29/78* | (2006.01) |
| *H01L 29/06* | (2006.01) |
| *H01L 27/07* | (2006.01) |
| *H01L 29/16* | (2006.01) |
| *H01L 29/10* | (2006.01) |
| *H01L 29/66* | (2006.01) |
| *H01L 29/423* | (2006.01) |

(52) U.S. Cl.
CPC ...... *H01L 29/7811* (2013.01); *H01L 27/0727* (2013.01); *H01L 29/0696* (2013.01); *H01L 29/1095* (2013.01); *H01L 29/16* (2013.01); *H01L 29/4238* (2013.01); *H01L 29/66712* (2013.01); *H01L 29/7804* (2013.01); *H01L 29/7813* (2013.01)

(58) Field of Classification Search
CPC ............ H01L 29/7397; H01L 29/0629; H01L 29/7811; H01L 28/20
See application file for complete search history.

(56) References Cited

U.S. PATENT DOCUMENTS 5,592,006 A * 1/1997 Merrill .................. H01L 29/435
                                                                257/140
2004/0262678 A1* 12/2004 Nakazawa .......... H01L 29/0619
                                                                257/330

(Continued)

FOREIGN PATENT DOCUMENTS

DE  102016118499 A1  3/2018
GB       2506141 A    3/2014

*Primary Examiner* — Zandra V Smith
*Assistant Examiner* — John M Parker
(74) *Attorney, Agent, or Firm* — Murphy, Bilak & Homiller, PLLC

(57) ABSTRACT

A transistor device comprises at least one gate electrode, a gate runner connected to the at least one gate electrode and arranged on top of a semiconductor body, a plurality of gate pads arranged on top of the semiconductor body, and a plurality of resistor arrangements. Each gate pad is electrically connected to the gate runner via a respective one of the plurality of resistor arrangements, and each of the resistor arrangements has an electrical resistance, wherein the resistances of the plurality of resistor arrangements are different.

16 Claims, 7 Drawing Sheets

(56) References Cited

U.S. PATENT DOCUMENTS

| | | | |
|---|---|---|---|
| 2007/0252168 A1* | 11/2007 | Shimoida | H01L 29/66068 |
| | | | 257/147 |
| 2010/0181627 A1 | 7/2010 | Willmeroth et al. | |
| 2011/0102059 A1* | 5/2011 | Stoisiek | H01L 29/7816 |
| | | | 327/512 |
| 2016/0027771 A1* | 1/2016 | Su | H01L 27/0255 |
| | | | 257/355 |
| 2018/0337171 A1* | 11/2018 | Losee | H01L 23/647 |

* cited by examiner

GPn may be provided, wherein n≥2.

TRANSISTOR DEVICE WITH GATE RESISTOR

TECHNICAL FIELD

The instant disclosure relates to a transistor device, more specifically an insulated gate power transistor device.

BACKGROUND

Insulated gate power transistor devices such as power MOSFETs (Metal Oxide Semiconductor Field-Effect Transistors) or IGBTs (Insulated Gate Bipolar Transistors) are widely used as electronic switches in various types of electronic applications. An insulated gate transistor device includes a drive input and an internal capacitance between nodes of the drive input. The nodes of the drive input are usually referred to as gate node and source node, and the internal capacitance is usually referred to as gate-source capacitance. The transistor device switches on and off dependent on a charging state of the gate-source capacitance, wherein the transistor is in an on-state when the charging state is such that a voltage across the gate-source capacitance is higher than a threshold voltage of the transistor device and the transistor device is in an off-state when the voltage across the gate-source capacitance is below the threshold voltage.

A switching speed, that is, how fast the transistor device switches from the off-state to the on-state, and vice versa, is dependent on how fast the gate-source capacitance charges or discharges when the drive voltage changes. This switching speed can be adjusted by providing a resistor between the gate node and the gate-source capacitance, wherein the resistance value determines the switching speed. Different applications usually require different switching speeds and, therefore, different resistance values. For a transistor device included in a semiconductor chip, a certain resistance value may be preset. This resistance value generally cannot be adjusted at a later stage. Therefore, a certain semiconductor chip with a certain preset resistance value may be used for one application, while it may not be suitable for other applications which require different resistance values.

SUMMARY

It is desirable to provide a semiconductor chip with a transistor device, that may be used in different applications requiring different resistance values for the resistor coupled between the gate node and the gate-source capacitance.

One example relates to a transistor device comprising at least one gate electrode, a gate runner connected to the at least one gate electrode and arranged on top of a semiconductor body, a plurality of gate pads arranged on top of the semiconductor body, and a plurality of resistor arrangements. Each gate pad is electrically connected to the gate runner via a respective one of the plurality of resistor arrangements, and each of the resistor arrangements has an electrical resistance, wherein the resistances of the plurality of resistor arrangements are different.

A further example relates to a method. The method comprises forming a gate runner on top of a semiconductor body, forming a plurality of gate pads on top of the semiconductor body, and forming a plurality of resistor arrangements in the semiconductor body. Each of the plurality of resistor arrangements is formed to electrically connect one of the gate pads to the gate runner, and each of the plurality of resistor arrangements is formed to provide a different electrical resistance between the gate runner and the respective gate pad.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
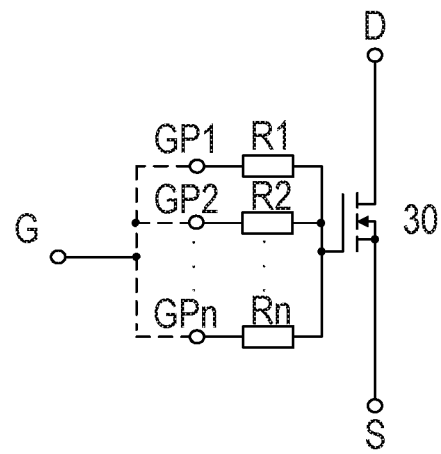
FIG. 1 shows an equivalent circuit diagram of a transistor device with a plurality of resistors.
Figure 2A:
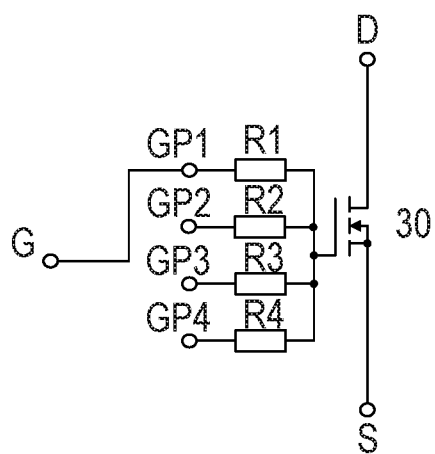
FIGS. 2A and 2B show equivalent circuit diagrams of a transistor device with a plurality of resistors, with one of the resistors coupled between a gate terminal and the transistor device.
Figure 2B:
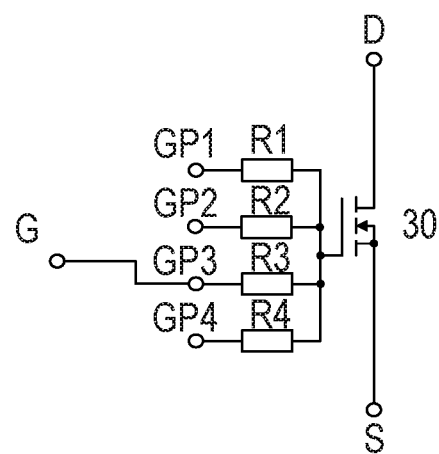

FIG. 1 schematically illustrates an equivalent circuit diagram of a transistor device 30. The transistor device 30 comprises a drain node D and a source node S with a load path formed between the drain node D and the source node S. The transistor device 30 further comprises a gate node G. The gate node G may be electrically coupled to the gate of the transistor device 30 via one of a plurality of resistors R1, R2, . . . , Rn. A separate gate pad GP1, GP2, . . . , GPn may be provided for each of the plurality of resistors R1, R2, . . . , Rn. The gate node G may be electrically coupled to one of a plurality of, e.g., four, different gate pads GP1, GP2, . . . , GPn, as is exemplarily illustrated in FIG. 2. The four gate pads GP1, GP2, GP3, GP4 illustrated in FIG. 2, however, are only one example. Any suitable number of gate pads GP1, GP2, . . . , GPn, may be provided, wherein n≥2.

Each of the different gate pads GP1, GP2, ..., GPn, is coupled to the gate of the transistor device 30 via an individual one of a plurality of resistors R1, R2, ..., Rn. Each of the resistors R1, R2, ..., Rn has an electrical resistance, wherein the resistances of the plurality of resistors R1, R2, ..., Rn are different. That is, the resistance of each of the plurality of resistors R1, R2, ..., Rn differs from the resistance of each of the remaining resistors in the arrangement.

A transistor device 30 as illustrated in FIG. 1, includes an internal capacitance between its gate node G and its source node S. This internal capacitance is usually referred to as gate-source capacitance and is not specifically illustrated in FIGS. 1 and 2. The transistor device 30 switches on and off dependent on a charging state of the gate-source capacitance, wherein the transistor device 30 is in an on-state when the charging state is such that a voltage across the gate-source capacitance is higher than a threshold voltage of the transistor device 30 and the transistor device 30 is in an off-state when the voltage across the gate-source capacitance is below the threshold voltage.

A switching speed, that is, how fast the transistor device 30 switches from the off-state to the on-state, and vice versa, is dependent on how fast the gate-source capacitance charges or discharges when the drive voltage changes. This switching speed can generally be adjusted by providing a resistor R1, R2, ..., Rn between the gate node G and the gate-source capacitance. A different electrical resistance of the resistor R1, R2, ..., Rn results in a different switching speed. Therefore, contacting the gate (or the gate-source capacitance) of the transistor device 30 via a first gate pad GP1 and a first resistor R1 having a first electrical resistance results in a different switching speed than contacting the gate (or the gate-source capacitance) of the transistor device 30 via a second gate pad GP2 and a second resistor R2 having a second electrical resistance, and so on. Generally, the gate (or the gate-source capacitance) of the transistor device 30 is contacted via only one of the plurality of gate pads GP1, GP2, ..., GPn, while the remaining gate pads GP1, GP2, ..., GPn are not used. This is exemplarily illustrated in FIG. 2A, where the gate (or the gate-source capacitance) of the transistor device 30 is contacted via the first gate pad GP1 and the first resistor R1, and in FIG. 2B, where the gate (or the gate-source capacitance) of the transistor device 30 is contacted via the third gate pad GP3 and the third resistor R3. The transistor device 30 may alternatively be contacted via any of the other gate pads, in the present example GP2 or GP4.

By providing a plurality of gate pads GP1, GP2, ..., GPn and resistors R1, R2, ..., Rn on a single semiconductor body or a single semiconductor chip, this gives a user of the device the opportunity to contact the gate (or the gate-source capacitance) of the transistor device 30 via a desired one of the plurality of gate pads GP1, GP2, ..., GPn. According to one example, one of the resistors R1, R2, ..., Rn has an electrical resistance of 0 Ohm, a second one of the resistors R1, R2, ..., Rn has an electrical resistance of 2.5 Ohm, a third one of the resistors R1, R2, ..., Rn has an electrical resistance of 5 Ohm, and a fourth one of the resistors R1, R2, ..., Rn has an electrical resistance of 10 Ohm. These values, however, are only examples. Any other suitable electrical resistances may be provided for a single transistor device 30.

Figure 3:
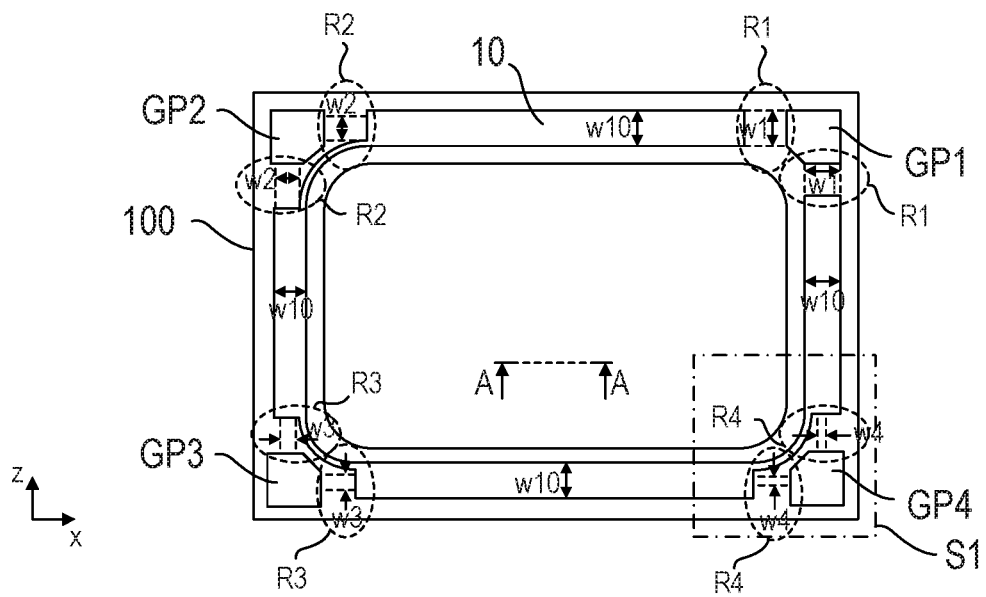
FIG. 3 schematically illustrates a top view of a transistor device that includes a gate runner and a plurality of gate pads connected to the gate runner.

Now referring to FIG. 3, it is exemplarily illustrated how a plurality of gate pads GP1, GP2, ..., GPn may be provided on a single semiconductor body 100. FIG. 3 schematically illustrates a top view of one example of a transistor device 30. The transistor device 30 includes a semiconductor body 100, a gate runner 10 and a plurality of gate pads GP1, GP2, ..., GPn arranged on top of the semiconductor body 100. FIG. 3 illustrates those sections of the semiconductor body 100 on which the gate runner 10 and the gate pads GP1, GP2, ..., GPn are arranged. According to one example, this section represents the complete semiconductor body 100. According to another example, the semiconductor body 100 includes further sections adjoining the section illustrated in FIG. 3, but not illustrated in FIG. 3. The gate runner 10 may comprise a metal line. According to one example, the metal line includes tungsten (W), or an aluminum-copper alloy (AlCu).

The gate runner 10 and the gate pads GP1, GP2, ..., GPn being arranged "on top" of the semiconductor body 100 means that the gate runner 10 and the gate pads GP1, GP2, ..., GPn are arranged above a surface of the semiconductor body 100 and does not necessarily mean that the gate pads GP1, GP2, ..., GPn and the gate runner 10 adjoin the semiconductor body 100. Instead, additional layers such as insulation layers or metallization layers can be arranged between the surface of the semiconductor body 100 and the gate runner 10 and the gate pads GP1, GP2, ..., GPn.

The gate runner 10 forms a closed ring, e.g., along the outer edges of the semiconductor body 100. The gate runner 10, however, may include different sections. First sections of the gate runner 10 are arranged between different gate pads GP1, GP2, ..., GPn, and second sections of the gate runner 10 are arranged in such regions where the gate runner 10 runs past one of the gate pads GP1, GP2, ..., GPn. The first sections of the gate runner 10 may have a first width w10 in a horizontal direction x or z of the semiconductor body 100. The second sections of the gate runner 10 may have a second width in a horizontal direction of the semiconductor body 100, wherein the second width is less than the first width w10. Just for the purpose of illustration, the closed ring formed by the gate runner 10 is rectangular. However, this ring may alternatively be implemented with another geometry such as elliptical or circular as well.

As is schematically illustrated in FIG. 3, the gate runner 10 may be electrically contacted via any one of the plurality of gate pads GP1, GP2, ..., GPn. Each gate pad GP1, GP2, ..., GPn is electrically connected to the gate runner 10 via a respective one of a plurality of resistor arrangements R1, R2, ..., Rn. The resistor arrangements R1, R2, ..., Rn of the present example, however, are not formed on top of the semiconductor body 100 but rather within the semiconductor body 100, which will be described in further detail below.

Figure 4:
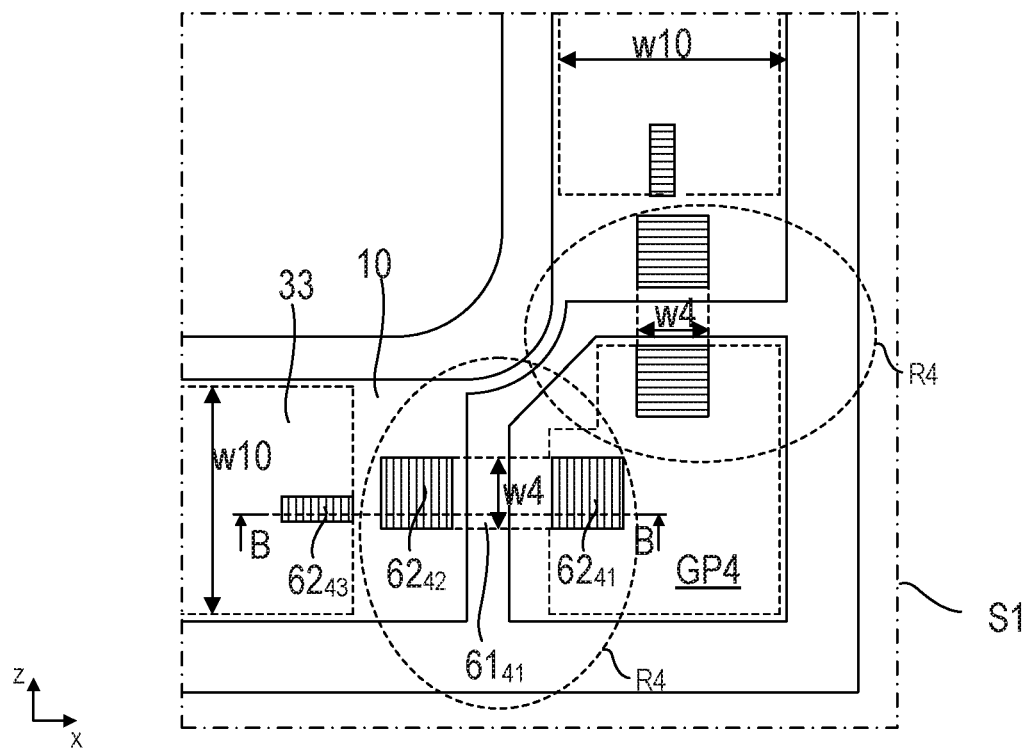
FIG. 4 schematically illustrates a section of the transistor device of FIG. 3 in more detail.

Now referring to FIG. 4, a section of the semiconductor body 100 of FIG. 3 is illustrated in greater detail. The section illustrated in FIG. 4 is marked with a dot and dash line in FIG. 3. The section illustrated in FIG. 4 includes the fourth gate pad GP4 and the related fourth resistor arrangement R4, the fourth resistor arrangements R4 providing an electrical connection between the fourth gate pad GP4 and the gate runner 10. The general principle which will be described by means of the fourth gate pad GP4 and the fourth resistor arrangement R4 in the following, may also be appropriately applied for any other gate pads GP1, GP2, ..., GPn and related resistor arrangements R1, R2, ..., Rn provided on the semiconductor body 100. The resistor arrangement R4 comprises a conducting layer $61_{41}$ within the semiconductor body 100. In the top view of the semiconductor body 100 illustrated in FIG. 4, the conducting layer $61_{41}$ is arranged within the semiconductor body 100 and thus is concealed by other layers of the semiconductor body 100. Therefore, the conducting layer $61_{41}$ is indicated in dashed lines in FIG. 4. This, however, is only an example. According to another example, the conducting layer $61_{41}$ may be arranged on top of the semiconductor body 100 instead of within the semiconductor body 100.

The conducting layer $61_{41}$ may be directly or indirectly coupled to each of the gate pad GP4 and the gate runner 10. In this way, the conducting layer $61_{41}$ may form at least one part of the resistor arrangement R4 which forms the electrical connection between the gate pad GP4 and the gate runner 10. The conducting layer $61_{41}$ may be a semiconductor layer, for example.

Figure 5:
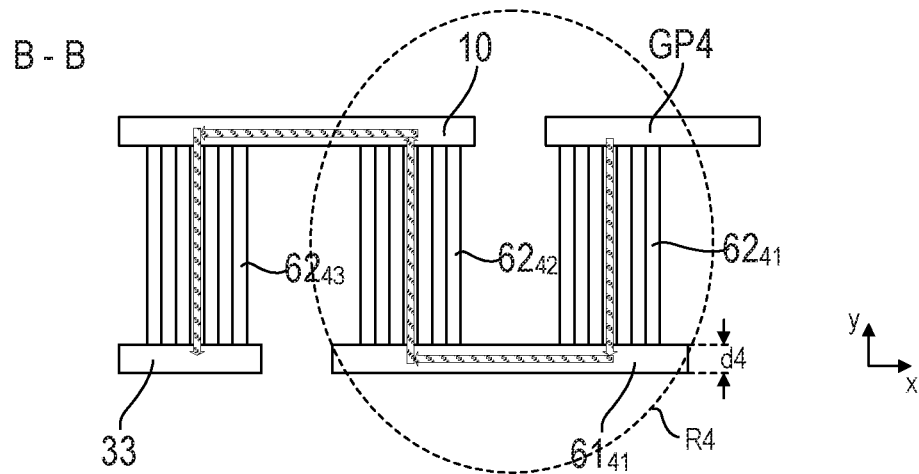
FIG. 5 schematically illustrates a resistor arrangement connecting a gate pad to the gate runner according to one example.

The conducting layer $61_{41}$ may have a first thickness d4 in a vertical direction y of the semiconductor body 100. This is exemplarily illustrated in the simplified cross-sectional view in FIG. 5. FIG. 5 schematically illustrates the resistor arrangement R4 in a section view B-B, as indicated in FIG. 4. Further, the conducting layer $61_{41}$ may have a first width w4 in a horizontal direction z of the semiconductor body 100, wherein the horizontal direction z is perpendicular to the vertical direction y. An electrical resistance of the conducting layer $61_{41}$ essentially depends on its thickness d4 and its width w4 or, in other words, on the size of its cross-sectional area. According to one example, the first thicknesses dn of the individual resistor arrangements Rn arranged on the semiconductor body 100 are identical, while the first widths wn of the plurality of resistor arrangements Rn differ from each other. In this way, each resistor arrangement Rn may have an electrical resistance which differs from the electrical resistances of each of the other resistor arrangements Rn on the same semiconductor body 100. However, according to another example, it is also possible that the first thicknesses dn of the different conducting layers $61_{41}$ differ from each other while the first widths wn of the different conducting layers $61_{41}$ are identical.

As is exemplarily illustrated in FIGS. 4 and 5, the conducting layer $61_{41}$ may be arranged within the semiconductor body 100. That is, the conducting layer $61_{41}$ is arranged distant to the gate pad GP4 and the gate runner 10 in the vertical direction y of the semiconductor body 100. As is schematically illustrated in FIGS. 4 and 5, the conducting layer $61_{41}$ and the gate pad GP4 may at least partly overlap in a horizontal direction x of the semiconductor body 100. Further, the conducting layer $61_{41}$ and the gate runner 10 may partly overlap in the horizontal direction x of the semiconductor body 100. The resistor arrangement R4 may further include a first via $62_{41}$ that electrically couples the gate pad GP4 to the conducting layer $61_{41}$. A second via $62_{42}$ may be provided to electrically couple the conducting layer $61_{41}$ to the gate runner 10. The first and second vias $62_{41}$, $62_{42}$ may be conventional vias including one or more electrical connections extending through the semiconductor body 100 in the vertical direction y. The first and second vias $62_{41}$, $62_{42}$ may be formed using any suitable electrically conductive material.

Furthermore, the gate runner 10 is electrically coupled to a gate electrode 33 of the transistor device 30. This is to provide a voltage across the gate-source capacitance of the transistor device 30 to switch the transistor device 30 on or off. The gate electrode 33 is generally arranged within the semiconductor body 100, which will be described in further detail with respect to FIGS. 6 and 10 below. Therefore, in the top view of the semiconductor body 100 of FIG. 4, the gate electrode 33 is concealed by other layers of the semiconductor body 100. Therefore, the gate electrode 33 is indicated in dashed lines in FIG. 4. In FIG. 5, the gate electrode 33 is illustrated as being arranged in the same plane as the conducting layer $61_{41}$. This, however, is only an example. The gate electrode 33 and the conducting layer $61_{41}$ may alternatively be arranged in different planes within the semiconductor body 100. For example, the gate electrode 33 may be arranged further away from the gate runner 10 than the conducting layer $61_{41}$ in the vertical direction y of the semiconductor body 100, or vice versa. A third via $62_{43}$ may be provided to electrically couple the gate runner 10 to the gate electrode 33. The third via $62_{43}$ may be similar to the first and second vias $62_{41}$, $62_{42}$ that have been described above.

Figure 6:
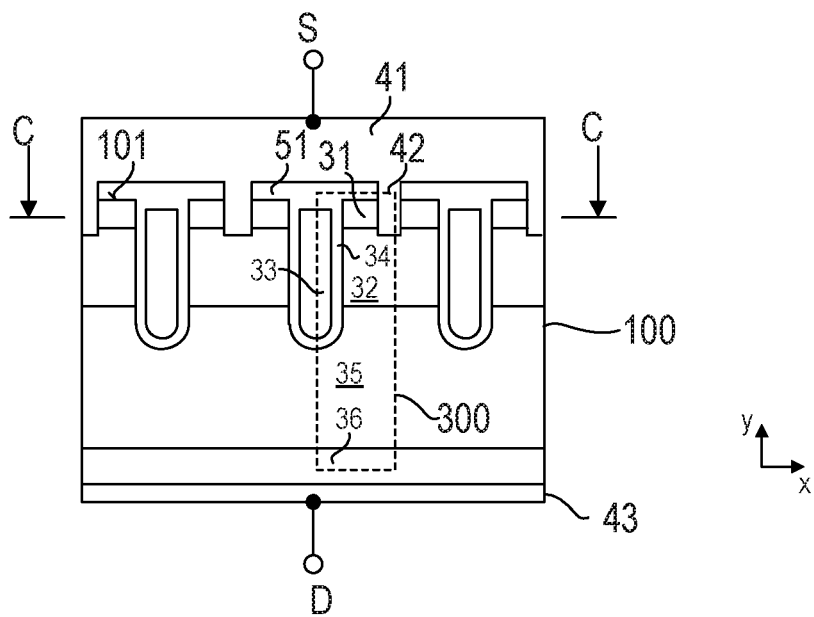
FIG. 6 shows a cross sectional view of a transistor device.

Now referring to FIG. 6, a cross sectional view of a transistor device including a plurality of transistor cells 300 is schematically illustrated in a section plane A-A (see FIG. 3). The plurality of transistor cells 300 may form the transistor device 30. Each transistor cell 300 includes a source region 31, a body region 32, a drift region 35, and a drain region 36, wherein the body region 32 separates the drift region 35 from the source region 31. Further, each transistor cell 300 includes a section of at least one gate electrode 33, and the body region 32 is adjacent this section of the gate electrode 33 and dielectrically insulated from the gate electrode 33 by a gate dielectric 34. In a conventional fashion, the at least one gate electrode 33 serves to control a conducting channel in the body region 32 between the source region 31 and the drift region 35.

The source region 31 and the body region 32 of each transistor cell 300 are electrically connected to a metallization 41 that forms a source node S of the transistor device 30 or that is electrically connected to the source node S. This metallization 41 may also be referred to as source metallization. The at least one gate electrode 33 is dielectrically insulated from the source metallization 41 by an insulation layer 51, which may be the same insulation layer on top of which the gate runner 10 (not shown in FIG. 6) is arranged (see, FIG. 8). The source metallization 41 is electrically connected to the source region 31 and the body region 32 via a contact plug 42. This contact plug 42 is electrically (ohmically) connected to the source region 31 and the body region 32.

Still referring to FIG. 6, the drift region 35 and the drain region 36 of each transistor cell 300 may be formed by semiconductor regions that are common to the individual transistor cells 300. The drain region 36 may adjoin a further metallization 43. This further metallization forms or is connected to a drain node D and may be referred to as drain metallization. In the example illustrated in FIG. 6, the source metallization 41 and the drain metallization 43 are arranged on opposite sides of the semiconductor body 100.

Figure 7:
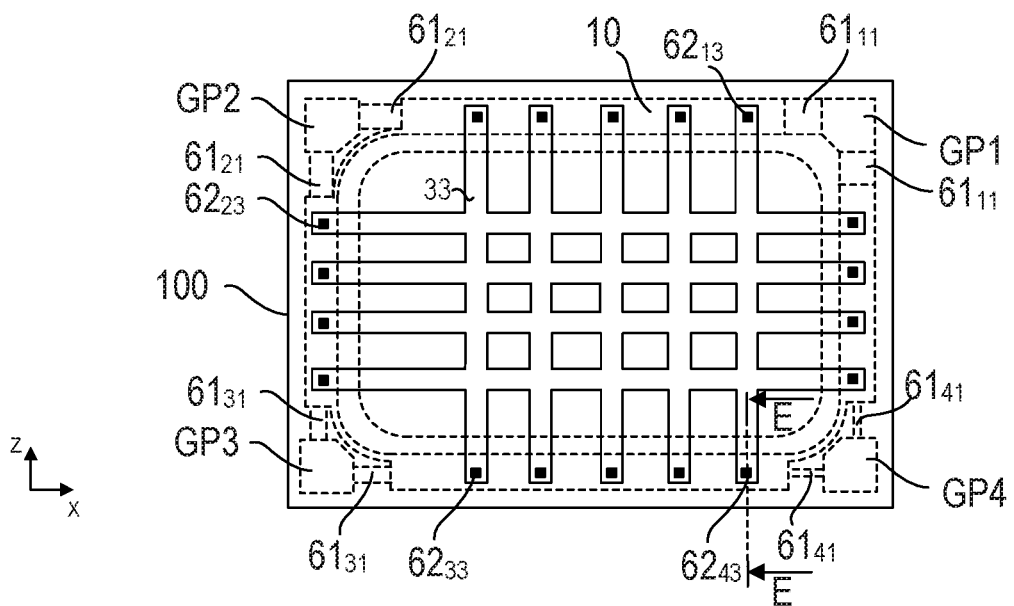
FIG. 7 schematically illustrates a cross sectional view of a transistor device with several elongated gate electrodes.

In the case of elongated gate electrodes 33, for example, the gate electrode 33 can be connected to the gate runner 10 at one end of the elongated trench that accommodates the gate electrode 33, similar to what is illustrated in FIG. 7. The gate electrodes 33 of the individual transistor cells 30 can be formed by one grid-shaped electrode. This is exemplarily illustrated in FIG. 7.

In each of the transistor cells 300 illustrated in FIG. 6, the source region 31 and the drift region 35 are semiconductor regions of a first doping type and the body region 32 is a semiconductor region of a second doping type complementary to the first doping type. The transistor device 30 can be implemented as an n-type transistor device or a p-type transistor device. In an n-type transistor device, the first doping type is an n-type and the second doping type is a p-type. In a p-type transistor device, the first doping type is a p-type and the second doping type is an n-type. Further, the transistor device can be implemented as a MOSFET or an IGBT. In a MOSFET, the drain region 36 has the first doping type, that is, the same doping type as the source region 31 and the drift region 35, and in an IGBT the drain region 36 has the second doping type, that is, a doping type complementary to the doping type of the source region 31 and the drift region 35.

The transistor cells 300 illustrated in FIG. 6 are trench transistor cells. That is, the at least one gate electrode 33 is arranged in a trench that extends from a surface 101 of the semiconductor body 100 into the semiconductor body 100. Implementing the transistor cells 300 as trench transistor cells, however, is only one example. According to another example (see FIG. 10), the transistor cells 300 are implemented as planar transistor cells, in which the gate electrode is arranged on top of the surface 101 of the semiconductor body 100.

According to one example, the at least one gate electrode 33 includes, or is even comprised of, a metal such as, for example, tungsten (W). According to one example, the gate electrode 33 includes a titanium nitride (TiN) layer in contact with the gate dielectric 34 and a tungsten (W) layer on top of the TiN layer. Using a metal provides for a very low ohmic resistance of the at least one gate electrode 33, which may be desirable for the reasons outlined below.

In the transistor device 30 explained above, a plurality of transistor cells 300 are connected in parallel. That is, the source regions 31 of these transistor cells 300 are connected to the source node S, the common drain region 36 is connected to the drain node D, and the at least one gate electrode 33 is connected to the gate node G, or the gate pads GP1, GP2, . . . , GPn, respectively.

The transistor device 30 may include a housing (package) in which the semiconductor body 100 is arranged. In this case, the gate pads GP1, GP2, . . . , GPn, the source metallization 41 and the drain metallization 43 may be connected to terminals that are accessible from outside the housing. Such housing and terminals, however, are not illustrated in the drawings.

Figure 8:
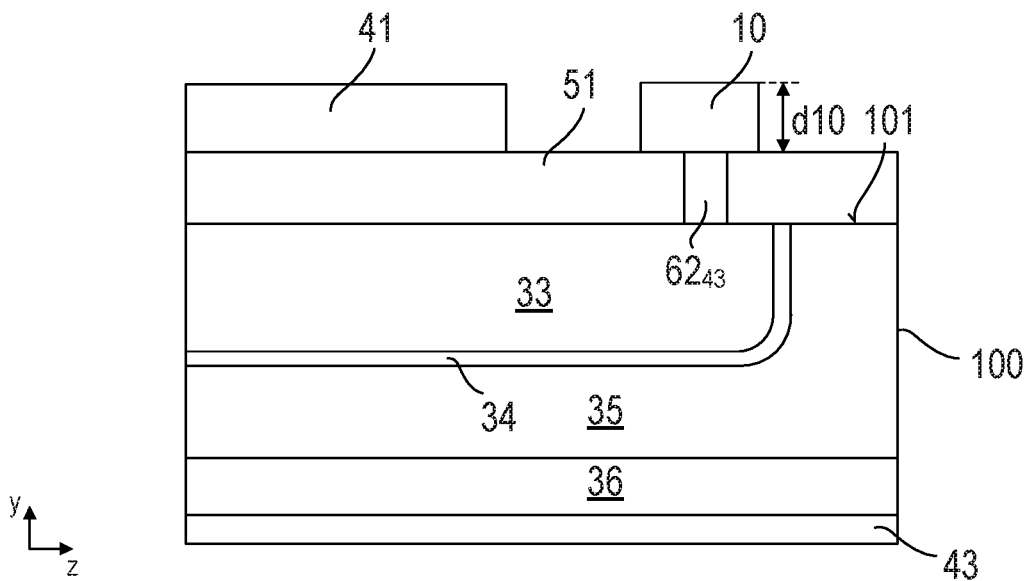
FIG. 8 schematically illustrates a cross sectional view of a transistor device according to one example.

Now referring to FIG. 8, an insulation layer 51 is formed on top of the first surface 101 of the semiconductor body 100 and the gate runner 10 is formed on this insulation layer 51. The insulation layer 51 is schematically illustrated as one layer in FIG. 8. This, however, is only an example. According to another example, the insulation layer 51 may include several sublayers. Further, metallization layers may be formed in this insulation layer 51. The third via $62_{43}$ is arranged in a trench that extends from the gate electrode 33 in the vertical direction y to the gate runner 10 in order to connect the gate electrode 33 to the gate runner 10.

Figure 9:
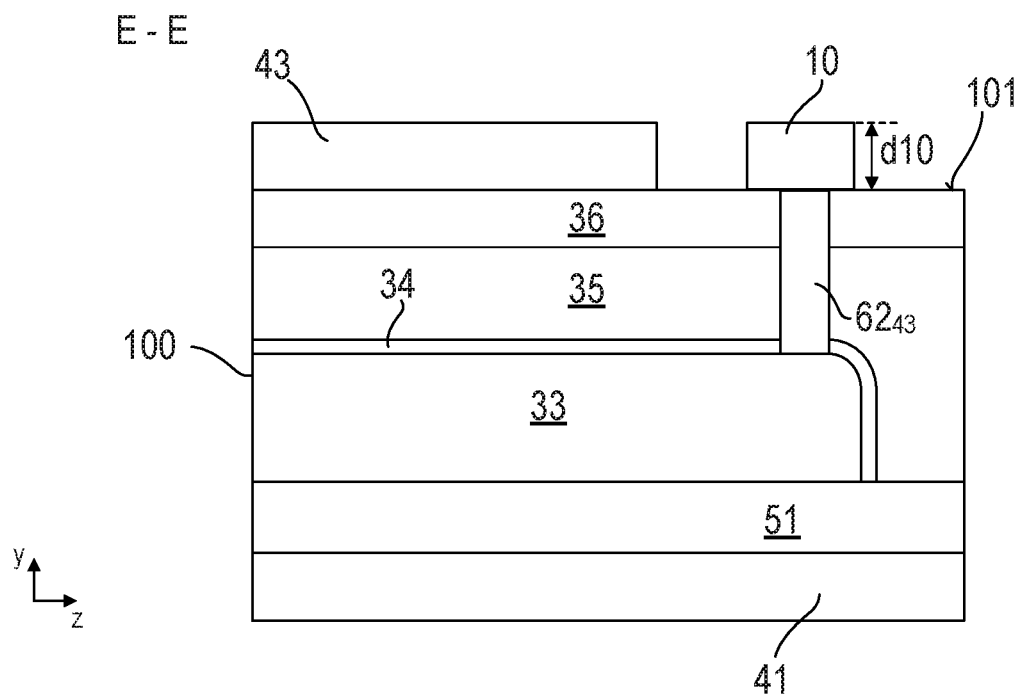
FIG. 9 schematically illustrates a cross sectional view of a transistor device according to a further example.

FIG. 9 schematically illustrates a third via $62_{43}$ for a so-called source-down transistor. In the example illustrated in FIG. 6, the source metallization 41 is arranged on a top side of the semiconductor body 100, wherein the top side is a side of the semiconductor body 100 on which the gate runner 10 is arranged. The drain metallization 43 in the example of FIG. 6 is arranged on a back side of the semiconductor body 100 opposite the top side. This, however, is only an example. It is also possible to arrange the drain metallization 43 on the top side of the semiconductor body 100 on which the gate runner 10 is arranged, and to arrange the source metallization 41 on the back side of the semiconductor body 100. This arrangement with the source metallization 41 arranged on the back side is generally known as a source-down transistor and is exemplarily illustrated in FIG. 9. The general structure of the source-down transistor illustrated in FIG. 9 is the same as the structure of the drain-down transistor illustrated in FIG. 8. The third via $62_{43}$ of the source-down transistor of FIG. 9, however, extends through the drain region 36, the drift region 35 and the gate dielectric 34, that is, to the opposite side of the semiconductor body 100 as compared to the drain-down transistor of FIG. 8.

FIG. 7 illustrates a transistor device 30 according to one example. In this example, the transistor device 30 includes only one gate electrode 33 that has the shape of a grid and comprises a plurality of longitudinal ends. In this example, the gate runner 10 overlaps each of these longitudinal ends, that is, each of the longitudinal ends is located below the gate runner 10. In the example illustrated in FIG. 7, all ends of the gate electrode 33 that are overlapped by the gate runner 10 are connected to the gate runner 10. However, it is also possible that some ends that are overlapped by the gate runner 10 are not directly connected to the gate runner 10 (not illustrated in the Figures). "Not directly connected" means that there is no via between the longitudinal end and the gate runner 10. However, such longitudinal ends are still indirectly connected to the gate runner 10 via sections of the gate electrode 33 and other longitudinal ends.

Figure 10:
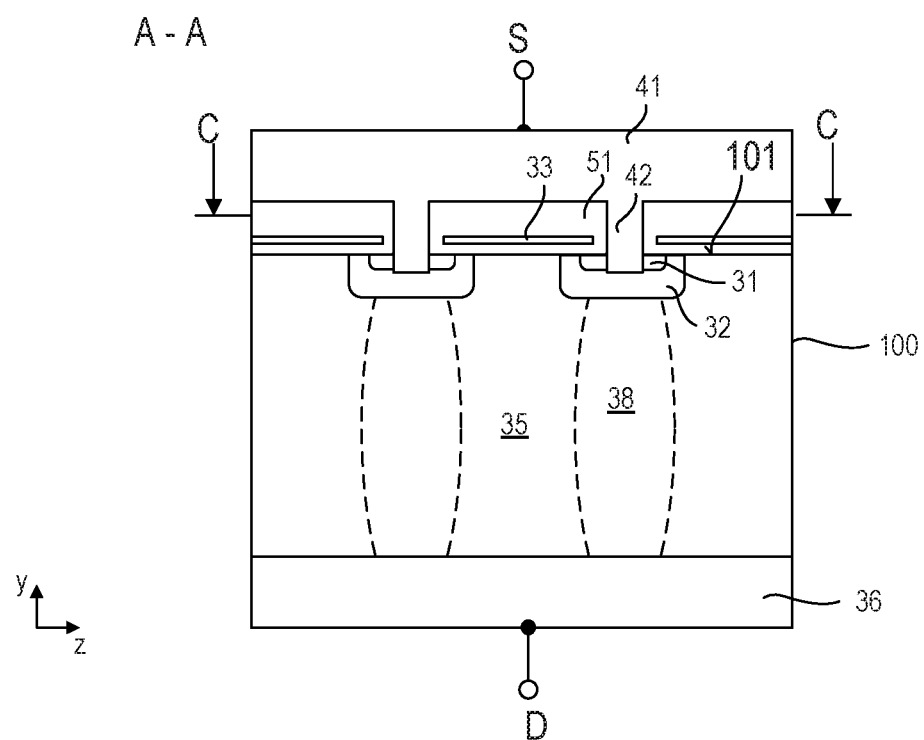
FIG. 10 shows a cross sectional view of another transistor device.

FIG. 10 illustrates a vertical cross sectional view of one section of a transistor device 30 in a section plane A-A according to one example. The transistor device 30 includes a semiconductor body 100. The semiconductor body 100 may include a conventional semiconductor material such as, for example, silicon (Si), silicon carbide (SiC), gallium nitride (GaN), gallium arsenide (GaAs), or the like. In FIG. 10, a section of the active region of the transistor device is shown. In the active region the transistor device includes at least one transistor cell with a gate electrode 33 that is dielectrically insulated from a body region 32 by a gate dielectric 34. The body region 32 is a doped semiconductor region in the active region of the semiconductor body 100. In the example illustrated in FIG. 10, the gate electrode 33 is arranged above a first surface 101 of the semiconductor body 100.

The transistor device 30 illustrated in FIG. 10 further includes a drift region 35. The drift region 35 adjoins the body region 32 of the at least one transistor cell and forms a pn-junction with the body region 32. The drift region 35 is arranged between the body region 32 of the at least one transistor cell and a drain region 36. The drain region 36 may adjoin the drift region 35 (as illustrated). According to another example (not illustrated) a field-stop-region of the same doping type as the drift region 35, but more highly doped than the drift region 35 is arranged between the drift region 35 and the drain region 36. Furthermore, the transistor device 30 includes at least one compensation region 38 of a doping type complementary to the doping type of the drift region 35. According to one example, the at least one compensation region 38 adjoins the body region 32 of the at least one transistor cell. According to one example, the transistor device 30 includes a plurality of transistor cells and each transistor cell includes a compensation region 38 adjoining the body region 32 of the respective transistor cell. In a vertical direction y of the semiconductor body 100, which is a direction perpendicular to the first surface 101, the at least one compensation region 38 extends towards the drain region 36. According to one example, the compensation region is spaced apart from the drain region 36 so that there is a section of the drift region 35 between compensation region 38 and the drain region 36. According to another example, the compensation region adjoins the drain region 36 (see FIG. 10).

Still referring to FIG. 10, the transistor device 30 further includes a source electrode 41. The source electrode 41 is electrically connected to the source region 31 and the body region 32 of the at least one transistor cell. This source electrode 41 forms a source node S or is electrically connected to a source node S of the transistor device 30. The transistor device 30 further includes a drain node D electrically connected to the drain region 36. A drain electrode electrically connected to the drain region 36 may form the drain node D. However, such drain electrode is not explicitly illustrated in FIG. 10.

The transistor device 30 can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one compensation region 38 is a p-type region. In a p-type transistor device, the source region 31 is a p-type region, the body region 32 is an n-type region, the drift region 35 is a p-type region, and the at least one compensation region 38 is an n-type region. The transistor device can be implemented as a MOSFET or as an IGBT. In a MOSFET, the drain region 36 has the same doping type as the drift region 35, and in an IGBT the drain region 36 (which may also be referred to as collector region) has a doping type complementary to the doping type of the drift region 35. For example, a doping concentration of the drain region 36 is selected from a range of between 1E15 and 1E22 cm$^{-3}$, doping concentrations of the drift region 35 and the compensation region 38 are selected from a range of between 1E12 and 8E16 cm$^{-3}$, and a doping concentration of the body region 32 is selected from between 8E16 cm$^{-3}$ and 5E17 cm$^{-3}$.

Figure 11:
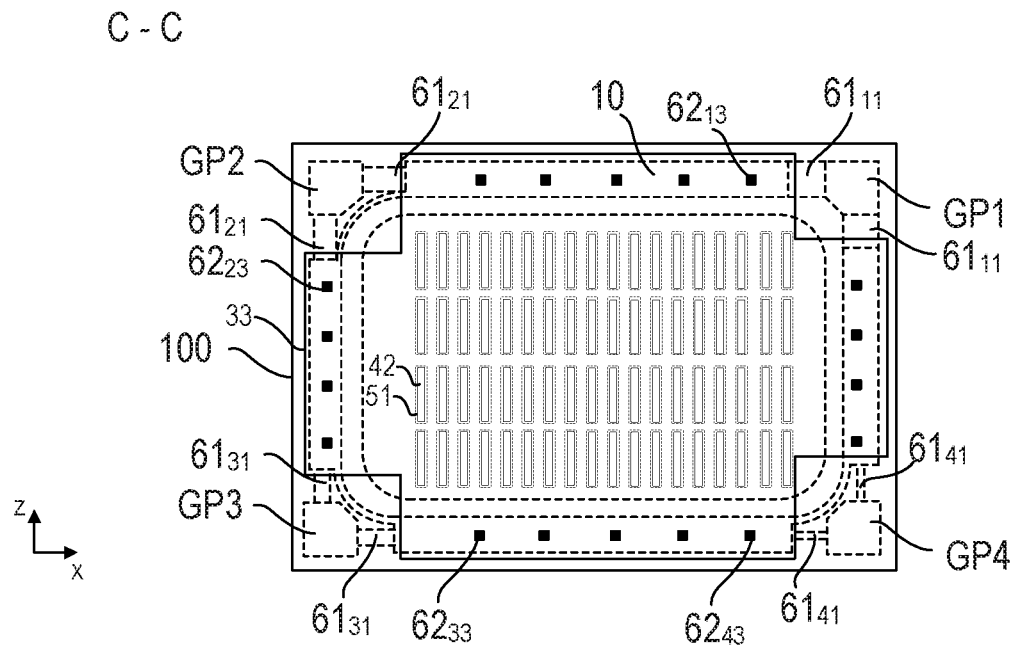
FIG. 11 schematically illustrates a cross sectional view of a transistor device with a planar gate electrode.

Now referring to FIG. 11, a top view on the semiconductor body 100 of a transistor device 30 is exemplarily illustrated, wherein the transistor device 30 is implemented including planar transistor cells, as has been described with respect to FIG. 10 above. The gate electrode 33 of the transistor device 30 may be a laminar layer within the semiconductor body 100. That is, the gate electrode 33 may be formed by a continuous layer within the semiconductor body 100. The gate electrode 33 and the gate runner 10 may overlap in edge regions of the semiconductor body 100. That is, the edge regions of the gate electrode 33 may be located below the gate runner 10. In the example illustrated in FIG. 11, all edge regions of the gate electrode 33 that are overlapped by the gate runner 10 are connected to the gate runner 10. However, it is also possible that some edge regions that are overlapped by the gate runner 10 are not directly connected to the gate runner 10 (not illustrated in the Figures). "Not directly connected" means that there is no via between the edge region and the gate runner 10. However, such edge regions are still indirectly connected to the gate runner 10 via sections of the gate electrode 33 and other edge regions. The gate electrode 33, however, may be interrupted or perforated in a regular pattern by the contact plugs 42 contacting the source region 31 and the body region 32, and by the insulation layer 51 arranged between the contact plugs 42 and the gate electrode 33. The contact plugs 42 may be formed by a plurality of elongated regions, as is exemplarily illustrated in FIG. 11. The shape and the positioning of the contact plugs 42 illustrated in FIG. 11, however, are only an example. Other forms and positions are also possible.

In the resistor arrangement Rn that has been described with respect to FIG. 5 above, a current flowing between the gate pad GPn and the gate runner 10 travels along the same current path in each direction. That is, a current flowing from the gate pad GPn to the gate runner 10 flows from the gate pad GPn through the first via $62_{41}$, the conducting layer $61_{41}$, and the second via $62_{42}$ to the gate runner 10, as is indicated with the arrows in FIG. 5. A current flowing in the opposite direction from the gate runner 10 to the gate pad GPn, flows along the same current path in the opposite direction, that is through the second via $62_{42}$, the conducting layer $61_{41}$, and the first via $62_{41}$ to the gate pad GPn. The electrical resistance, therefore, is always the same, regardless of the direction of the current. This, however, is only an example.

Figure 12:
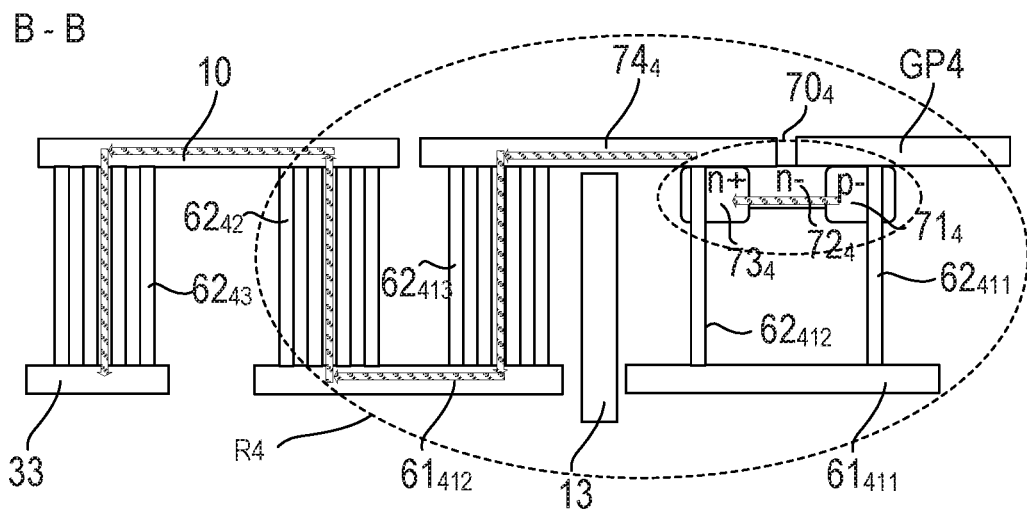
FIG. 12 illustrates a resistor arrangement connecting a gate pad to the gate runner according to another example.
Figure 13:
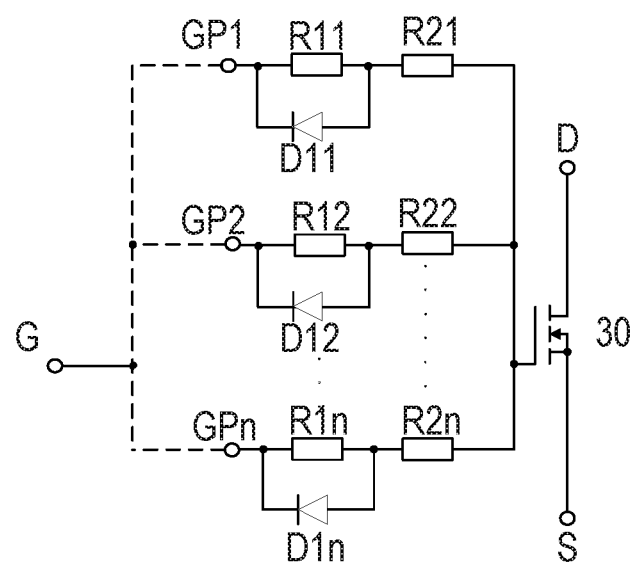
FIG. 13 shows an equivalent circuit diagram of a transistor device with a plurality of resistors and a plurality of diodes.

According to another example that is exemplarily illustrated in FIGS. 12 and 13, a current flowing from the gate pad GPn to the gate runner 10 may travel along a different current path than a current travelling in the opposite direction from the gate runner 10 to the gate pad GPn. In the example illustrated in FIGS. 12 and 13, the resistor arrangement Rn comprises a first resistor section R1n/$61_{n11}$, a second resistor section R2n/$61_{n12}$ and a diode D1n/$70_n$. The first resistor section R1n/$61_{n11}$ and the second resistor section R2n/$61_{n12}$ are coupled in series between the gate pad GPn and the gate runner 10. The first resistor section R1n/$61_{n11}$ has a first electrical resistance and the second resistor section R2n/$61_{n12}$ has a second electrical resistance. The first electrical resistance and the second electrical resistance may be identical or may differ from each other. The diode D1n/$70_n$ is coupled in parallel to the first resistor section R1n/$61_{n11}$ between the gate pad GPn and the second resistor section R2n/$61_{n12}$. The diode D1n/$70_n$ is in a blocking state, when a current between the gate pad GPn and the gate runner 10 flows in a first direction (when a voltage with a first polarity (blocking voltage) is applied to the diode D1n/$70_n$). When the diode D1n/$70_n$ is in a blocking state, the current, therefore, flows through the first resistor section R1n/$61_{n11}$ and the second resistor section R2n/$61_{n12}$. The electrical resistance in this case is essentially determined by the sum of the electrical resistance of the first resistor section R1n/$61_{n11}$ and the electrical resistance of the second resistor section R2n/$61_{n12}$ of the respective resistor arrangement Rn.

The diode D1n/$70_n$, however, is in a conducting state if a current flows in an opposite direction (when a voltage with a second polarity is applied to the diode D1n/$70_n$). When the diode D1n/$70_n$ conducts a current, the current flows through the second resistor section and through the diode D1n/$70_n$, instead of through the first resistor section R1n/$61_{n11}$, the diode D1n/$70_n$ thereby bypassing the first resistor section R1n/$61_{n11}$. Therefore, in this case, the electrical resistance of the resistor arrangement Rn is essentially determined by the electrical resistance of the second resistor section R2n/$61_{n12}$. In this way, the electrical resistance and, therefore, the switching speed may be different when the transistor device 30 is switched on, as compared to the electrical resistance and, consequently, the switching speed when the transistor device 30 is switched off. For example, in some applications it might be desirable that the switching speed when switching on the transistor device 30 is faster than the switching speed when switching off the transistor device 30, or vice versa. In the example illustrated in FIG. 13, the cathode of the diode D1n is coupled to the gate pad GPn and the anode of the diode is coupled to the common node between the first resistor section R1n and the second resistor section R2n. This, however, is only an example. According to another example, the anode of the diode D1n is coupled to the gate pad GPn and the cathode of the diode D1n is coupled to the common node between the first resistor section R1n and the second resistor section R2n.

As is exemplarily illustrated in FIG. 12, the first resistor section R1n/$61_{n11}$ may comprise a conducting layer $61_{n11}$, and the second resistor section R2n/61$_{n12}$ may comprise a conducting layer 61$_{n12}$. The conducting layer 61$_{n11}$ of the first resistor section R1n/61$_{n11}$ may be electrically insulated from the conducting layer 61$_{n12}$ of the second resistor section R2n/61$_{n12}$ by means of an additional insulation region 13. The insulation region 13 may be formed by a vertical column of insulating material formed in the semiconductor body 100. That is, a dimension of the insulation region 13 in a horizontal direction x of the semiconductor body 100 is substantially smaller than a dimension of the insulation region 13 in the vertical direction y of the semiconductor body 100. Such an insulation region 13, however, is optional.

The second resistor section R2n/61$_{n12}$ is electrically coupled to the gate runner 10 via the second via 62$_{n2}$, as has been described with respect to FIG. 5 above. The first via 62$_{n1}$, however, may be formed by three separate via sections, namely a first via section 62$_{n11}$, a second via section 62$_{n12}$, and a third via section 62$_{n13}$. The first via section 62$_{n11}$ is configured to electrically couple the gate pad GPn to the first resistor section 61$_{n11}$, the second via section 62$_{n12}$ is configured to electrically couple the first resistor section 61$_{n11}$ to an intermediate coupling layer 74$_n$, and the third via section 62$_{n13}$ is configured to electrically couple the intermediate coupling layer 74$_n$ to the second resistor section 61$_{n12}$. The diode 70$_n$ is arranged between the gate pad GPn and the intermediate coupling layer 74$_n$ in parallel to the first resistor section 61$_{n11}$. The diode 70$_n$ may comprise a first diode region 71$_n$ of a first conducting type and at least one second diode region 72$_n$, 73$_n$ of a second conducting type. For example, the first diode region 71$_n$ may be a p-type region and the at least one second diode region 72$_n$, 73$_n$ may be an n-type region. According to another example, the first diode region 71$_n$ may be an n-type region and the at least one second diode region 72$_n$, 73$_n$ may be a p-type region. As is exemplarily illustrated in FIG. 12, the diode 70$_n$ may be implemented as a so-called PIN diode comprising a low doped drift or base region 72$_n$ between a first emitter region 71$_n$ of a first doping type and a second emitter region 73$_n$ of a second doping type. Such a PIN diode is configured to block when a voltage with a first polarity (blocking voltage) is applied between the first and second emitter regions 71$_n$, 73$_n$, and is configured to conduct a current when a voltage with a second polarity is applied between the first and second emitter regions 71$_n$, 73$_n$. In the example illustrated in FIG. 12, the first emitter region 71$_n$ is arranged adjacent the gate pad GPn and the second emitter region 73$_n$ is arranged adjacent the intermediate coupling layer 74$_n$. This, however, is only an example. Depending on the direction a current should be allowed to flow through the first resistor section 61$_{n11}$, the first and second emitter regions 71$_n$, 73$_n$ could also be interchanged.

What is claimed is:

1. A transistor device, comprising:
   at least one gate electrode;
   a gate runner connected to the at least one gate electrode and arranged on top of a semiconductor body;
   a plurality of gate pads arranged on top of the semiconductor body; and
   a plurality of resistor arrangements; wherein
   each gate pad is electrically connected to the gate runner via a respective one of the plurality of resistor arrangements; and
   each of the resistor arrangements has an electrical resistance, wherein the resistances of the plurality of resistor arrangements are different.

2. The transistor device of claim 1, wherein
   the gate runner has an electrical resistance; and
   the electrical resistance of at least one of the plurality of resistor arrangements is greater than the electrical resistance of the gate runner.

3. The transistor device of claim 1, wherein
   each resistor arrangement comprises a first conducting layer within the semiconductor body;
   the first conducting layer of each of the resistor arrangements has a first thickness in a vertical direction of the semiconductor body; and
   the first thicknesses of the first conducting layers of the plurality of resistor arrangements are identical.

4. The transistor device of claim 3, wherein
   the first conducting layer of each of the resistor arrangements has a first width in a horizontal direction of the semiconductor body perpendicular to the vertical direction; and
   the first widths of the first conducting layers of the plurality of resistor arrangements differ from each other.

5. The transistor device of claim 3, wherein each resistor arrangement further comprises:
   a first via configured to electrically couple the respective gate pad to the first conducting layer; and
   a second via configured to electrically couple the respective first conducting layer to the gate runner.

6. The transistor device of claim 5, further comprising:
   at least one third via configured to electrically couple the gate runner to the at least one gate electrode.

7. The transistor device of claim 3, wherein the first conducting layers comprise polysilicon.

8. The transistor device of claim 1, wherein
   each resistor arrangement comprises a first conducting layer within the semiconductor body;
   the first conducting layer of each of the resistor arrangements has a first width in a horizontal direction parallel to a top surface of the semiconductor body on which the plurality of gate pads are arranged; and
   the first widths of the first conducting layers of the plurality of resistor arrangements differ from each other.

9. The transistor device of claim 1, wherein at least one of the plurality of resistor arrangements comprises a diode, a first resistor section and a second resistor section, wherein
   the first resistor section and the second resistor section are coupled in series between the respective gate pad and the gate runner; and
   the diode is coupled in parallel to the first resistor section between the respective gate pad and second resistor section.

10. The transistor device of claim 9, wherein
    each first resistor section has a first electrical resistance, and each second resistor section has a second electrical resistance;
    when an electrical current flows through the resistor arrangement in a first direction, the diode of the respective resistor arrangement is in a conducting state, and the electrical resistance of the respective resistor arrangement is determined essentially by the second electrical resistance; and
    when an electrical current flows through the resistor arrangement in a second direction, the diode of the respective resistor arrangement is in a blocking state, and the electrical resistance of the respective resistor arrangement is determined essentially by a sum of the first electrical resistance and the second electrical resistance of the respective resistor arrangement.

11. The transistor device of claim 1, wherein the semiconductor body has a rectangular shape and each of the at least two gate pads is arranged in one corner of the semiconductor body.

12. The transistor device of claim 1, further comprising:
a plurality of transistor cells each comprising a source region and a body region integrated in the semiconductor body,
wherein the body region is adjacent the at least one gate electrode and dielectrically insulated from the at least one gate electrode by a gate dielectric.

13. The transistor device of claim 1, wherein the at least one gate electrode comprises a plurality of elongated gate electrodes.

14. The transistor device of claim 1, wherein the at least one gate electrode comprises a grid shaped gate electrode.

15. A method comprising:
forming a gate runner on top of a semiconductor body;
forming a plurality of gate pads on top of the semiconductor body; and
forming a plurality of resistor arrangements in the semiconductor body; wherein
each of the plurality of resistor arrangements is formed to electrically connect one of the gate pads to the gate runner; and
each of the plurality of resistor arrangements is formed to provide a different electrical resistance between the gate runner and the respective gate pad.

16. The method of claim 15, wherein forming a plurality of resistor arrangements in the semiconductor body further comprises:
forming a plurality of first resistor sections and a plurality of second resistor sections, wherein a first resistor section and a corresponding second resistor section are coupled in series between one of the respective gate pads and the gate runner; and
forming a plurality of diodes, wherein each of the diodes is coupled in parallel to one of the first resistor sections between the respective gate pad and second resistor section.

* * * * *